United States Patent
Bradley et al.

(10) Patent No.: US 10,036,676 B1
(45) Date of Patent: Jul. 31, 2018

(54) MICROELECTROMECHANICAL SYSTEMS (MEMS) FORCE DIE WITH BURIED CAVITY VENTED TO THE EDGES

(71) Applicant: Honeywell International Inc., Morris Plains, NJ (US)

(72) Inventors: Alistair David Bradley, Hilliard, OH (US); Richard Alan Davis, Plano, TX (US); Richard Wade, Worthington, OH (US)

( * ) Notice: Subject to any disclaimer, the term of this patent is extended or adjusted under 35 U.S.C. 154(b) by 0 days.

(21) Appl. No.: 15/459,841

(22) Filed: Mar. 15, 2017

(51) Int. Cl.
*G01L 1/04* (2006.01)
*G01L 1/18* (2006.01)
*B81B 3/00* (2006.01)

(52) U.S. Cl.
CPC .............. *G01L 1/18* (2013.01); *B81B 3/0021* (2013.01); *B81B 2201/0264* (2013.01); *B81B 2203/0127* (2013.01); *B81B 2207/09* (2013.01)

(58) Field of Classification Search
CPC . G01L 1/18; B81B 3/0021; B81B 2201/0264; B81B 2203/0127; B81B 2207/09
USPC .................................................... 73/862.632
See application file for complete search history.

(56) References Cited

U.S. PATENT DOCUMENTS

| | | |
|---|---|---|
| 5,157,973 A | 10/1992 | Ciminelli |
| 5,583,296 A | 12/1996 | Mokwa et al. |
| 6,401,545 B1 * | 6/2002 | Monk ................. G01L 19/0038 73/706 |
| 6,550,337 B1 * | 4/2003 | Wagner ................. G01L 9/0042 73/715 |
| 7,113,179 B2 | 9/2006 | Baker et al. |
| 9,010,190 B2 * | 4/2015 | Potasek ................. B81B 7/0048 73/715 |
| 9,316,552 B2 * | 4/2016 | Wagner ................. G01L 9/0054 |
| 2006/0185429 A1 * | 8/2006 | Liu ...................... B60C 23/0408 73/146.5 |
| 2010/0155866 A1 * | 6/2010 | Guo ....................... C23C 14/021 257/419 |
| 2011/0005326 A1 * | 1/2011 | Bentley ................. G01L 19/148 73/754 |

FOREIGN PATENT DOCUMENTS

JP    2011094967 A    5/2011

* cited by examiner

*Primary Examiner* — Max Noori
(74) *Attorney, Agent, or Firm* — Seager, Tufte & Wickhem, LLP; Brian Tufte (57) ABSTRACT

A force sensor may comprise a sensing die comprising a cap and a support. Generally, a first surface of the support may comprise a buried cavity and one or more channels. The one or more channels may extend from the buried cavity towards the outer edges of the support and may ensure the force sensor is not sensitive to ambient or atmospheric pressure variation. The cap may be bonded to the first surface of the support, thereby forming a sensing diaphragm located above the buried cavity. Additionally, the force sensor may comprise an actuation element to sense a change in force from an external media. The actuation element may transmit the force to the sensing diaphragm causing it to deflect into the buried cavity. The one or more sense elements on the sensing diaphragm may provide an indication of the change in force based on the amount of deflection.

20 Claims, 4 Drawing Sheets

MICROELECTROMECHANICAL SYSTEMS (MEMS) FORCE DIE WITH BURIED CAVITY VENTED TO THE EDGES

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

FIELD

The present disclosure relates generally to force sensors, and more particularly, to force sensors comprising a buried cavity and an over-force stop.

BACKGROUND

Force sensors are used in a wide variety of applications including, for example, commercial, automotive, aerospace, industrial, and medical applications. Generally, force sensors may rely on a displacement of a component (e.g. stress-field applied to a stress-sensitive element) to measure the presence of a force and/or an amount of the force applied on the force sensor. Force sensors often use a force sensing die that is mounted to a force sensor package using a die attach. Typically, the force sensing die is often configured to detect a force by converting mechanical stress induced by a force acting on a sensing diaphragm of the force sensing die into an electrical output signal.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example;

The terms "about" or "approximately" or the like, when used with a number, may mean that specific number, or alternatively, a range in proximity to the specific number, as understood by persons of skill in the art field (for example, +/−10%); and If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

The embodiments of this disclosure generally relate to force sensors, and more particularly, force sensors comprising a buried cavity and one or more channels located between a cap and a support of a sensing die.

As force sensors are developed to fit into smaller and smaller packaging, the challenges faced to achieve high overforce protection levels increase. Typical force sensors or load cells in the market achieve their overforce protection with one or more mechanical features added to the design. In the case of load cells, this may be done by putting a mechanical travel limiter on the beam element that is sensing. However, for load cells and force sensors, smaller packaging may limit the ability to include mechanical features (such as stop or control elements).

Embodiments of the disclosure provide overforce protection within the structure of the sensor itself, wherein the structure may not rely on any final assembly controls, but rather makes use of the precise wafer bonding process. Embodiments may include a sensing die comprising a cap that is bonded to a support. The cap may contain a Wheatstone bridge, sensing elements, and a diaphragm that may move under an applied force. The support may comprise a buried/shallow cavity created (e.g. etched) on it. The diaphragm of the cap, when displaced by the operating force, may move down into the buried/shallow cavity of the support. As the load continues to increase beyond a first (operating) force range and into a second (proof) force range, the diaphragm may approach the bottom surface of the buried/shallow cavity and eventually may contact the bottom surface and may stop moving. When the diaphragm contacts the bottom surface of the cavity, this may transfer the entire load from the applied force to the support and may limit the stress on the diaphragm, thereby preventing overforce (and possible damage) of the diaphragm.

Typically, pressure sensors comprising a buried/shallow cavity and operating within the low force range (e.g. less than 10 Newtons) may be sensitive to the pressure within the buried/shallow cavity which may have significant effects on the accuracy of the pressure sensor. Conventionally, the buried/shallow cavity of the pressure sensor may be vacuum sealed between the cap and the support. Thus, the output of the sensing die may rely on both the atmospheric pressure variation and the local ambient pressure disturbances. To reduce/eliminate atmospheric and ambient pressure effects on the force sensor, disclosed embodiments may comprise venting of the buried/shallow cavity.

In some embodiments, the buried/shallow cavity may be vented to the bottom of the sensing die. Generally, this may require additional processing of the sensing die and the packaging of the force sensor to ensure the gauge reference is not blocked. In addition, venting at the bottom of the sensing die may not exclude errors from local pressure disturbances which may occur at the top of the pressure sensor rather than at the bottom. For example, in application, air may be compressed in the cover when the actuation element of the force sensor is being pushed down by external tubing. In this case, the output signal may reflect the effects of air compression above the force sensor. Thus, a bottom vent of the buried/shallow cavity may not effectively exclude pressure disturbances on the force sensor.

Embodiments of the disclosure may comprise side venting of the buried/shallow cavity. For example, one or more channels may extend from the buried/shallow cavity in the support to the edges of the support. Venting at the sides of the sensing die may ensure that the diaphragm has the same pressure above and below it. Therefore, the device may only be sensitive to force changes to the sensing die (as coupled through the actuation element). Additionally, venting at the sides keeps the bottom of the cavity planar and free from holes or other irregularities. This may be important for force sensors comprising overforce protection where the diaphragm may be configured to contact the bottom of the buried/shallow cavity. Venting at the bottom of the cavity may have limited the reliability of the force sensor with repeated force cycling. In some embodiments, the one or more channels may be formed during the same process as the forming of the buried/shallow cavity—thereby, reducing cost of the sensing die. Additionally, the assembly and use of the force sensor may not be affected because the sensing die may be mounted just like a non-vented sensing die (for example, there may be no need to form a reference hole in the bottom of the sensing die and the force sensor packaging).

An exemplary sensing die of a force sensor may be fabricated starting with a cap wafer and a support wafer. Typically, a plurality of recesses may be formed on the first surface of a support wafer. Each recess of the plurality of recesses may define a buried/shallow cavity of each sensing die. Typically, a plurality of channels may be formed on the first surface of the support wafer such that the plurality of channels intersects one or more of the plurality of recesses. The plurality of channels may extend outward from the plurality of buried/shallow cavities such that each buried/shallow cavity comprises an equal number of intersecting channels. In some embodiments, the plurality of channels may extend outward from the corners of the respective buried/shallow cavity. In some embodiments, the plurality of channels may perpendicularly intersect with the edges of the plurality of buried/shallow cavities. A variety of microfabrication techniques including but not limited to lithography techniques, wet etching techniques (e.g. KOH), and dry etching techniques (e.g. deep reactive-ion etching (DRIE), plasma etching, etc.) may be used to form the plurality of recesses and the plurality of channels. Generally, the depth of each buried/shallow cavity may be greater than the depth of the one or more channels.

Typically, the cap wafer and the support wafer may be silicon wafers bonded together using a variety of bonding techniques including direct bonding techniques (e.g. silicon fusion bonding). Generally, direct bonding the cap wafer to the support wafer may minimize the thermal mismatch between the materials. Once the cap wafer is bonded to the support wafer, a part of the cap wafer may define (e.g. lay above) the buried/shallow cavity, thereby conveniently forming a sensing diaphragm. In some embodiments, standard pattern, implant, diffusion, and/or metal interconnect processes may be used to form one or more sense elements on a first surface of the cap wafer. For example, one or more piezoresistive sense elements may be formed on the sensing diaphragm. The piezoresistive sense elements may be configured to have an electrical resistance that varies according to an applied mechanical stress (e.g. deflection of the force sensing diaphragm). The piezoresistive sense elements can thus be used to convert the applied force into an electrical signal. In some instances, the piezoresistive components may include a silicon piezoresistive material; however, other non-silicon materials may be used. In some cases, the piezoresistive sense elements may be connected in a Wheatstone bridge configuration (full or half bridge). It will generally be understood that the piezoresistive sense elements are only one example of a force sensing element, and it is contemplated that any other suitable sensing elements may be used, as desired.

In some embodiments, one or more bond pads may be formed on the first surface of the cap and adjacent to the sensing diaphragm. Metal, diffusion, or other interconnect may be provided to interconnect the one or more piezoresistive sense elements and the one or more bond pads. In some embodiments, signal conditioning circuitry may also be formed in or on the first surface of the cap. The signal conditioning circuitry may condition one or more sensor signals received from the one or more sense elements before providing a conditioned output to the one or more of the bond pads. Generally, the signal conditioning circuitry may include amplification, analog-to-digital conversion, offset compensation circuitry, linearization, temperature compensation, and/or other suitable signal conditioning functions.

Generally, the bonded cap wafer and the support wafer may be diced to form a plurality of sensing die. Typically, wafer dicing may comprise scribing and breaking, mechanical sawing, and/or laser cutting. Prior to the process of wafer dicing, the plurality of buried/shallow cavities may be vacuum sealed between the cap wafer and the support wafer as would be the case during a standard process of fabricating a sensing die with a buried/shallow cavity. However, once the bonded cap wafer and the support wafer are diced, the plurality of buried/shallow cavities may be vented as the one or more channels are exposed to the edges of the sensing die. This may equalize the pressure above and below the sensing diaphragm. Typically, dicing of the sensing die may occur once the support wafer comprising a plurality of recesses and a plurality of channels is bonded to the cap wafer. In some embodiments, a plurality of sense elements and a plurality of bond pads may be attached to the first side of the cap wafer before or after the dicing process is complete.

In use, a force to be sensed may be provided to a first end of the actuation element. The force to be sensed may be transmitted by the actuation element to the sensing diaphragm. The applied force may deform the sensing diaphragm located within the cap. The sensing diaphragm may deflect into the buried/shallow cavity. Typically, the force sensor may detect a change in force at a first rate while the sensing diaphragm moves freely within the buried/shallow cavity. Generally, the sensing diaphragm may at least partially contact the surface of the buried/shallow cavity. The force sensor may detect a change in force at a second rate once the sensing diaphragm at least partially contacts the surface of the buried/shallow cavity. Additionally, the buried/shallow cavity may be vented to the edges of the sensing die by one or more channels to eliminate errors due to local pressure disturbances and/or atmospheric pressure variations. Typically, by venting the buried/shallow cavity to the edges of the sensing die, the pressure above and below the sensing diaphragm may be equal.

Generally, in use, the deflection of the diaphragm by the actuation element may stress the one or more sense elements on the force sensing diaphragm. When the sense elements are piezoresistive sense elements, applying a current through the sense elements provides a signal that corresponds to the amount of force applied to the sensing diaphragm. Generally, the signal may be communicated from the one or more sense elements to the bond pads which may typically be disposed on the force sensing die such that when assembled, the wire bonds pads may be accessible for electrical connection to other components via wire bonds or the like. In some cases, the resulting signal may be conditioned by conditioning circuitry and output via electrical leads. While persons of skill should understand the disclosed embodiments based on the above disclosure, the following figures may provide specific examples that may further clarify the disclosure.

Figure 1:
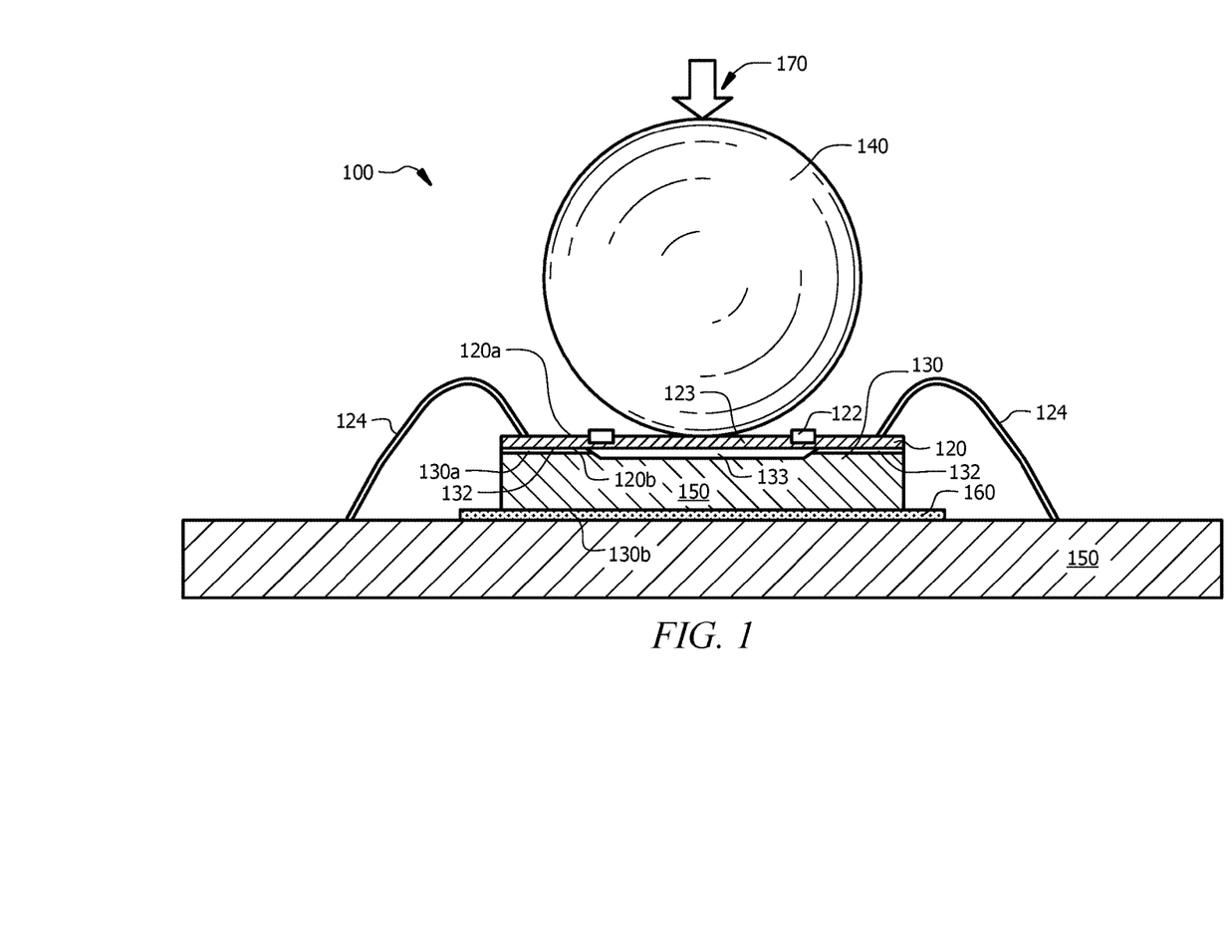
FIG. 1 illustrates a cross-sectional view of an exemplary embodiment of a force sensor.

Turning now to the drawings, FIG. 1 illustrates a cross-sectional view of an exemplary embodiment of a force sensor 100. The exemplary force sensor 100 of FIG. 1 comprises an actuation element 140, a sensing die 110, and a substrate 150. The sensing die 110 shown in FIG. 1 comprises a cap 120 and a support 130. Typically, the cap 120 may be bonded to a first surface 130a of the support 130 using a variety of bonding techniques including direct bonding techniques. For example, a silicon oxide bonding layer may be located between a second surface 120b of the cap 120 and the first surface 130a of the support 130 which may allow bonding of the cap 120 to the support 130 by silicon fusion bonding. Generally, the first surface 130a of the support 130 may comprise a buried/shallow cavity 133 and one or more channels 132 vented to the edges of the sensing die 110 as shown in the exemplary embodiment of FIG. 1. Venting of the buried/shallow cavity 133 may reduce and/or eliminate effects of atmospheric pressure variation and/or local ambient pressure disturbances on the force sensor 100. Venting of the buried/shallow cavity 133 may allow the force sensor 100 to be sensitive only to force changes occurring as a result of the applied pressure by the sense media 170 contacting the actuation element 140. In other words, venting of the buried/shallow cavity 133 may lead to identical pressure on both the top and the bottom of the sensing diaphragm 123.

In the exemplary embodiment of FIG. 1, the actuation element 140 is a spherical ball bearing and may comprise stainless steel, a polymer, a ceramic, another suitable metal, and/or another suitable material (e.g. polymer based objects). In some embodiments, the actuation element 140 may comprise a different shape. For example, the actuation element 140 may be T-shaped, cylindrical, trapezoidal, triangular, elliptical, or any other shape comprising at least one end configured to make focal contact with the sensing diaphragm 123 of the sensing die 110. Generally, the actuation element 140 may be configured to contact the sensing diaphragm 123 located above the buried/shallow cavity 133 of the support 130. In the exemplary embodiment of FIG. 1, the sensing diaphragm 123 supports one or more sense elements 122 on a first side 120a of the cap 120. Typically, the sense elements 122 may electrically communicate with one or more bond pads located on a first surface of the cap (shown in FIG. 5). The one or more bond pads may allow for electrical connection to other components using wire bonds. In the exemplary embodiment of FIG. 1, the wire bonds 124 may electrically communicate with electrical traces on the substrate 150. Generally, the substrate 150 may include a ceramic material (e.g. Alumina, PCB). However, it is contemplated that other suitable materials may be used in addition to or as an alternative to the ceramic material, as desired. Additionally, as shown in the embodiment of FIG. 1, a second surface 130b of the support 130 may be bonded to the substrate 150. In some embodiments, the bond 160 may comprise at least one of: direct bonding, adhesive, solder, or any combinations thereof.

Figure 2A:
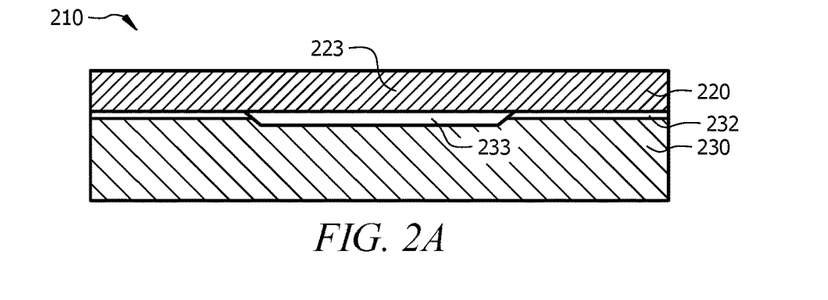
FIG. 2A illustrates a cross-sectional view of an exemplary embodiment of a sensing die comprising a cap, a support, a sensing diaphragm, a cavity, and one or more channels.

FIG. 2A illustrates a cross-sectional view of an exemplary embodiment of a sensing die 210 comprising a cap 220, a support 230, a diaphragm 223, a buried/shallow cavity 233, and one or more channels 232 (similar to the sensing die 110 shown in FIG. 1). Typically, the sensing die 210 may comprise a cap 220 and a support 230 formed from silicon wafers. In the exemplary embodiment of FIG. 2A, the support 230 comprises a recess and a plurality of channels 232. Typically, the recess may define a buried/shallow cavity 233 of the sensing die 210 such that the sensing diaphragm 223 may deflect into the buried/shallow cavity 233 as the actuation element senses force from the sense media. Additionally, the plurality of channels 232 may be formed to extend outward from the buried/shallow cavity 233. In this manner, the buried/shallow cavity 233 may be vented to the outer edges of the sensing die 210 to equalize pressure above and below the sensing diaphragm 223. The exemplary embodiment of FIG. 2A illustrates two channels 232 formed symmetrically on either side of the buried/shallow cavity 233. In some embodiments, there may be additional channels formed about the buried/shallow cavity 233. For example, there may be one channel, two channels, four channels, six channels, eight channels, nine channels, etc. Typically, the number of channels 232 may be configured in a symmetric manner about the buried/shallow cavity 233. However, in some embodiments, the channels 232 may lay asymmetrically about the buried/shallow cavity 233. Additionally, the buried/shallow cavity 233 may have a larger depth than the plurality of channels 232 as shown in FIG. 2A.

To form the buried/shallow cavity 233 and the plurality of channels 232, a variety of micro-fabrication techniques including but not limited to lithography techniques, wet etching techniques (e.g. KOH), and dry etching techniques (e.g. deep reactive-ion etching (DRIE), plasma etching, etc.) may be used. Generally, once the buried/shallow cavity 233 and the plurality of channels 232 are formed, the cap 220 may be bonded to the support 230 using a variety of bonding techniques including direct bonding techniques. Typically, during direct bonding of the cap 220 to the support 230, the buried/shallow cavity 233 and the plurality of channels 232 may remain unrestricted to allow for air flow to and from the plurality of channels 232 and the buried/shallow cavity 233.

In some embodiments, the thickness of the cap 220 and the support 230 may vary. For example, in some embodiments, the support 230 may have a greater thickness than the cap 220 as shown in the exemplary embodiment of FIG. 2A. In some embodiments, the cap 220 may have a greater thickness than the support 230. In some embodiments, the cap 220 and the support 230 may have equal thickness. In an exemplary embodiment, the total height of the sensing die 210 may be approximately 400 microns with the cap 220 and the support 230 having a height of approximately 200 microns each.

Figure 2B:
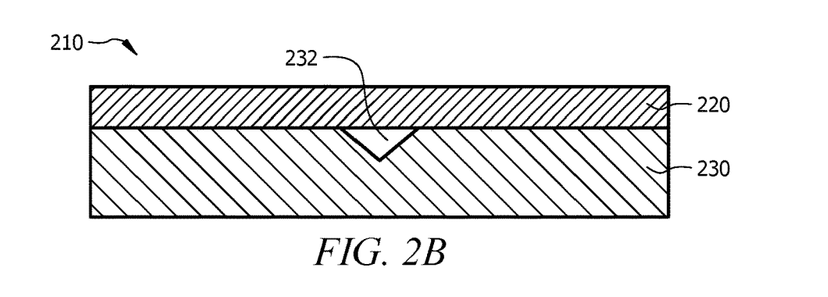
FIG. 2B illustrates a side view of an exemplary embodiment of a sensing die (similar to the exemplary embodiment of the sensing die shown in FIG. 2A) comprising a cap, a channel, and a support.

FIG. 2B illustrates a side view of the exemplary embodiment of a sensing die 210 shown in FIG. 2A comprising a cap 220, a channel 232, and a support 220. Generally, the cap 220 may be bonded to the support 230 in a similar manner as the one discussed in reference to FIG. 2A. Additionally, the buried/shallow cavity and the plurality of channels 232 may be etched in a similar manner as the one discussed in reference to FIG. 2A. In the exemplary embodiment of FIG. 2B, a side view of one channel 232 of a plurality of channels is shown. The exemplary channel 232 comprises a 'V' groove. Generally, 'V' grooves may be formed from KOH wet etching. In other embodiments, the shape of the plurality of channels 232 may vary (e.g. square groove, rectangular groove, rounded groove, etc.), and a variety of other micro-fabrication techniques (e.g. DRIE, plasma etching, etc.) may be used to form the buried/shallow cavity and the plurality of channels 232.

Figure 3:
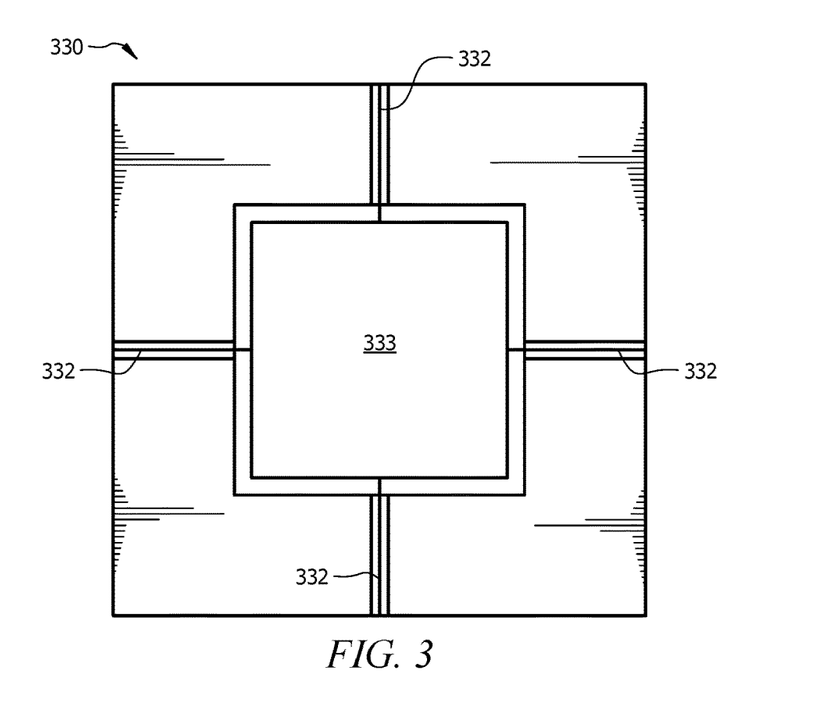
FIG. 3 illustrates a top view of the support of a sensing die comprising a cavity and a plurality of channels.

FIG. 3 illustrates a top view of the support 330 of a sensing die comprising a buried/shallow cavity 333 and a plurality of channels 332. Generally, the support 330 may be formed from a support wafer comprising a plurality of supports. Typically, a sensing die may be formed by bonding a cap wafer to the support wafer (comprising a plurality of buried/shallow cavities 333 and a plurality of channels 332) and then dicing the bonded cap wafer and support wafer to form a plurality of sensing die. Typically, after dicing the wafer, each buried/shallow cavity 333 may be vented to the edges of its respective support 330 as shown in the exemplary embodiment of FIG. 3. Additionally, the buried/shallow cavity 333 may be etched so that the edges of the buried/shallow cavity 333 are slanted (e.g. beveled). In the embodiment of FIG. 3, each channel 332 extends outward from the edges of the buried/shallow cavity 333. Although the shape of the buried/shallow cavity 333 may vary, it may typically be a square due to the micro-fabrication technique being used to etch the buried/shallow cavity 333. Additionally, depending on the type of micro-fabrication technique, the location of the channels 332 may be changed (e.g. channels 332 may extend outward from the corners of the buried/shallow cavity 333 to the corners of the sensing die).

Figure 4A:
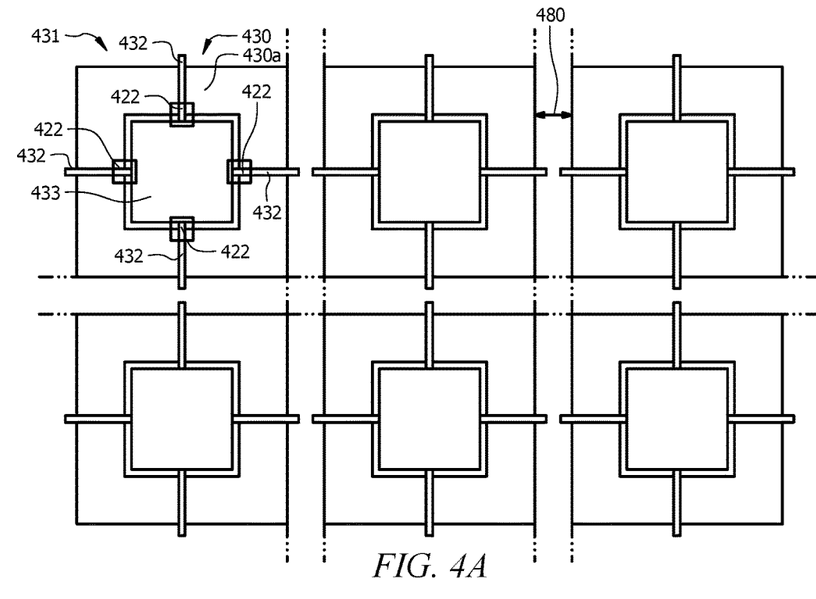
FIG. 4A illustrates a top view of an exemplary support wafer comprising one or more supports.

FIG. 4A illustrates a top view of an exemplary support wafer 431 comprising one or more supports 430. Generally, a plurality of recesses may be formed on a first surface 430a of the support wafer 431. The plurality of recesses may define a buried/shallow cavity 433 of each sensing die. Generally, a plurality of channels 432 may be formed on the first surface 430a of the support wafer 431 and may intersect one or more of the plurality of recesses. The plurality of channels 432 may extend outward from the buried/shallow cavities 433 such that each buried/shallow cavity 433 comprises an equal number of intersecting channels. In the exemplary embodiment of FIG. 4A, the plurality of channels 432 are formed to perpendicularly intersect each buried/shallow cavity 433. Additionally, as shown as an example on the top, left support, the sense elements 422 may be placed above each intersection between the plurality of channels 432 and the buried/shallow cavity 433. Typically, the sense elements 422 may be placed on a first surface of the cap, and the second surface of the cap may be bonded to the first surface 430a of the support 430. In this manner, the sense elements 422 may be placed in the locations indicated by the top, left support 430. Generally, the placement of the plurality of sense elements 422 relative to the plurality of channels 432 and the buried/shallow cavity 433 may stay consistent for each support 430 within a support wafer 431.

In the exemplary embodiment of FIG. 4A, the support wafer 431 may be diced. Generally, wafer dicing may comprise scribing and breaking, mechanical sawing, and/or laser cutting. Prior to the process of wafer dicing, the support wafer 431 comprising a plurality of buried/shallow cavities 433 and a plurality of channels 432 may be bonded to a cap wafer. Once bonded, the plurality of buried/shallow cavities 433 and the plurality of channels 432 may be vacuum sealed between the cap wafer (shown in FIG. 5) and the support wafer 431. Typically, once the bonded cap wafer and the support wafer 431 are diced (as shown by the gaps 480 between the individual sensing die), the plurality of buried/shallow cavities 433 may be vented to the edges of the respective sensing die. Generally, the spacing/gap 480 shown between the individual sensing die in FIG. 4A may not exist during the fabrication process. Typically, the plurality of channels 432 may be formed in a continuous manner between each buried/shallow cavity 433.

Figure 4B:
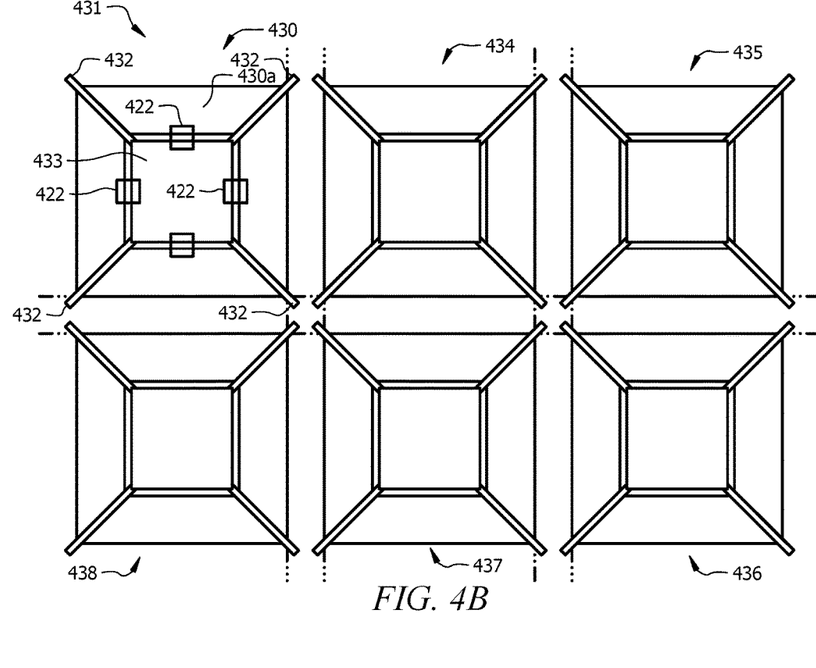
FIG. 4B illustrates an alternative top view of an exemplary support wafer comprising one or more supports.

FIG. 4B illustrates an alternative top view of an exemplary support wafer 431 comprising one or more supports 430, 434, 435, 436, 437, 438. Generally, a plurality of buried/shallow cavities 433 may be formed on a first surface 430a of the support wafer 431. Typically, the plurality of channels 432 may extend outward from the plurality of buried/shallow cavities 433. In the exemplary embodiment of FIG. 4B, the plurality of channels 432 are formed to extend from a corner of the buried/shallow cavity 433 to the corner of the respective sensing die. Additionally, as shown as an example on the top, left support, the sense elements 422 may be placed at the center of the four edges of the buried/shallow cavity 433. In this manner, the plurality of channels 432 may avoid the sense elements 422 which may improve stability of the sensing die. In the exemplary embodiment of FIG. 4B, the sense element placement is shown as an example on the top, left support 430; however, the sense elements may be placed in a similar location with respect to the other supports 434, 435, 436, 437, 438 comprised within the support wafer 431. Generally, the wafer dicing process may be similar to the process described in reference to FIG. 4A.

Figure 5:
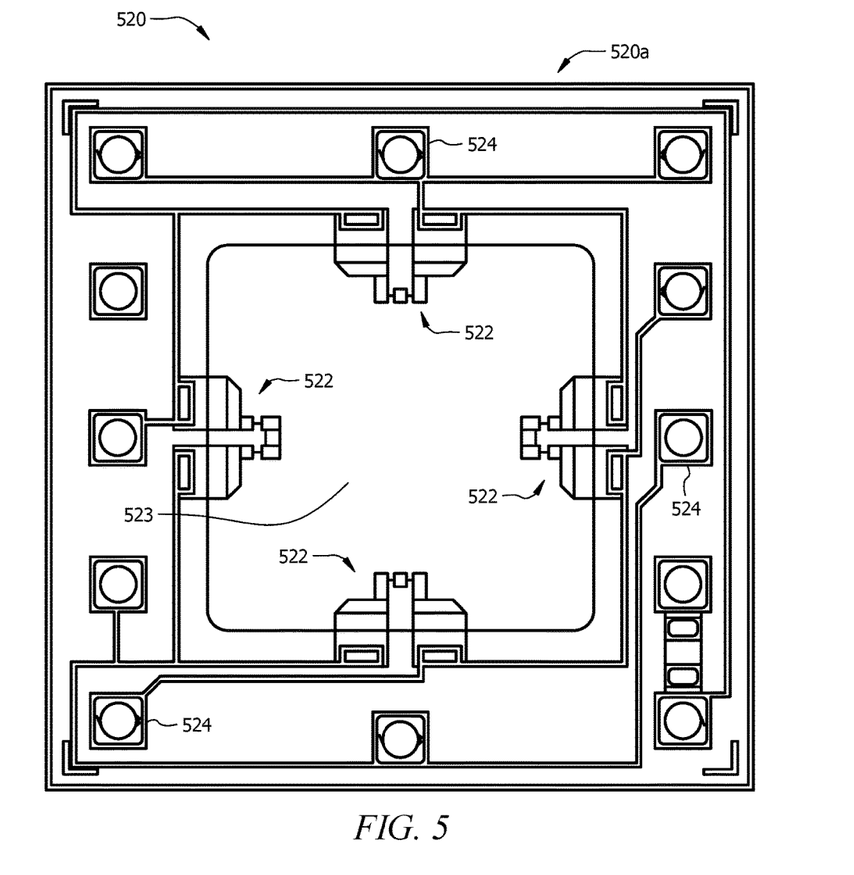
FIG. 5 illustrates a schematic, top view of an exemplary embodiment of a cap of a sensing die.

FIG. 5 illustrates a schematic, top view of an exemplary embodiment of a cap 520 of a sensing die. Generally, a second surface of the cap 520 may be bonded to a support. Typically, the portion of the cap 520 disposed on or adjacent to the buried/shallow cavity may be a sensing diaphragm 523. Additionally, as shown in FIG. 5, the cap 520 of the sensing die may have one or more sensing elements 522 disposed on or adjacent to the sensing diaphragm 523, such as piezoresistive sensing elements 522 or components formed using suitable fabrication or printing techniques. For example, starting with the silicon cap 520, standard pattern, implant, diffusion, and/or metal interconnect processes may be used to form one or more sense elements 522 on a first surface 520a of the cap 520. For example, one or more piezoresistive sense elements 522 may be formed on the sensing diaphragm 523. The piezoresistive sense elements

522 may be configured to have an electrical resistance that varies according to an applied mechanical stress (e.g. deflection of the sensing diaphragm 523). The piezoresistive sense elements 522 can thus be used to convert the applied force or pressure into an electrical signal. In some instances, the piezoresistive components may include silicon piezoresistive material; however, other non-silicon materials may be used.

Additionally, as shown in FIG. 5, one or more bond pads 524 may be formed on the first surface 520a of the cap 520 and adjacent to the sensing diaphragm 523. Metal, diffusion, or other interconnects may be provided to interconnect the one or more piezoresistive sense elements 522 and the one or more bond pads 524. As shown in FIG. 5, one or more of the piezoresistive sense elements 522 can be electrically coupled to one or more of the bond pads 524.

Having described device embodiments above, especially with regard to the figures, various additional embodiments can include, but are not limited to the following:

In a first embodiment, a force sensor comprising: a sensing die comprising a cap and a support, wherein the cap is coupled to a first surface of the support and comprises a sensing diaphragm, wherein the support comprises a buried cavity in the first surface, and wherein the sensing diaphragm is located adjacent to (and interacts with) the buried cavity; one or more channels located between the first surface of the support and the cap, wherein the one or more channels extend from the buried cavity to the outer edges of the support; and one or more sense elements supported by the sensing diaphragm of the cap. A second embodiment can include the force sensor of the first embodiment, further comprising an actuation element configured to transmit a force to the sensing diaphragm of the sensing die. A third embodiment can include the force sensor of the first to second embodiments, further comprising one or more electrical contacts supported by the cap, wherein each of the one or more electrical contacts are positioned adjacent to the sensing diaphragm and are electrically connected to the one or more sense elements. A fourth embodiment can include the force sensor of the first to third embodiments, further comprising a substrate located adjacent to the sensing die, wherein the substrate comprises electrical traces, and wherein the one or more electrical contacts are configured to be electrically coupled to the electrical traces. A fifth embodiment can include the force sensor of the first to fourth embodiments, wherein the substrate is bonded to a second surface of the support, and wherein the bond comprises at least one of: direct bonding, adhesive, solder, or any combinations thereof. A sixth embodiment can include the force sensor of the first to fifth embodiments, wherein the substrate is formed from at least one of a ceramic board or a laminated board. A seventh embodiment can include the force sensor of the first to sixth embodiments, further comprising one or more bond pads, wherein the one or more electrical contacts is electrically coupled to the one or more bond pads. An eighth embodiment can include the force sensor of the first to seventh embodiments, wherein the buried cavity is defined by a void between a second surface of the cap and the first surface of the support. A ninth embodiment can include the force sensor of the first to eighth embodiments, wherein the one or more sense elements comprise one or more piezoresistive elements. A tenth embodiment can include the force sensor of the first to ninth embodiments, wherein the actuation element is formed from a metal, a ceramic, a polymer, or any combination thereof. An eleventh embodiment can include the force sensor of the first to tenth embodiments, wherein the one or more channels and the cavity are formed by etching, and wherein etching comprises at least one of: KOH wet etching, Deep Reactive Ion Etching (DRIE), plasma etching, or any combinations thereof. A twelfth embodiment can include the force sensor of the first to eleventh embodiments, wherein the one or more channels vent the buried cavity to the edges of the sensing die, wherein the one or more channels ensure the output signal from the force sensor is related to the force applied by the actuation element on the diaphragm, and wherein venting the cavity to the edges of the sensing die removes ambient pressure variation and atmospheric pressure variation and equalizes the pressure above and below the diaphragm. A thirteenth embodiment can include the force sensor of the first to twelfth embodiments, wherein a surface of the cavity comprises a planar, uniform surface, wherein the sensing diaphragm is configured to contact the surface of the cavity. A fourteenth embodiment can include the force sensor of the first to thirteenth embodiments, wherein the sensing diaphragm and the one or more sense elements are configured to provide an output that increases at a first rate while the sensing diaphragm moves freely within the cavity and increases at a second rate while the diaphragm is in contact with the surface of the cavity. A fifteenth embodiment can include the force sensor of the first to fourteenth embodiments, further comprising a silicon oxide bonding layer located between a second surface of the cap and the first surface of the support. A sixteenth embodiment can include the force sensor of the first to fifteenth embodiments, wherein the second surface of the cap is bonded to the first surface of the support by silicon fusion bonding. A seventeenth embodiment can include the force sensor of the first to sixteenth embodiments, wherein the depth of the cavity is greater than the depth of the one or more channels. An eighteenth embodiment can include the force sensor of the first to seventeenth embodiments, wherein the height of the sensing die is approximately 400 microns. A nineteenth embodiment can include the force sensor of the first to eighteenth embodiments, wherein the height of the cap is approximately 200 microns, and wherein the height of the support is approximately 200 microns. A twentieth embodiment can include the force sensor of the first to nineteenth embodiments, wherein the depth of the cavity is between approximately 0.5 microns and approximately 25 microns.

Exemplary embodiments might also relate to a method for detecting force using a force sensor (e.g. similar to those described above, which may be considered optionally incorporated herein with respect to the discussion of the system). Such method embodiments, for example, might include, but are not limited to, the following:

In a twenty-first embodiment, a method for detecting force using a force sensor, the method comprising: applying a force to the force sensor, the force sensor comprising a sensing die, wherein the sensing die comprises a cap and a support, wherein a buried cavity and one or more channels are located between the cap and the support, wherein the one or more channels extend from the buried cavity to the outer edges of the support, wherein a portion of the cap defines a sensing diaphragm, and wherein the force sensor comprises one or more sense elements supported by the sensing diaphragm and an actuation element configured to transmit a force to the sensing diaphragm; detecting a force increase at a first rate while the sensing diaphragm moves freely within the cavity; at least partially contacting the sensing diaphragm to a surface of the cavity; detecting the force increase at a second rate while the sensing diaphragm at least partially contacts the surface of the cavity; and venting the buried cavity by the one or more channels (to remove/prevent external pressure variation). A twenty-second embodiment can include the method of the twenty-first embodiment, wherein the one or more channels vent the buried cavity to the edges of the sensing die, wherein venting the cavity to the edges of the sensing die removes ambient pressure variation and atmospheric pressure variation and equalizes the pressure above and below the diaphragm, and wherein the output signal from the force sensor indicates the force applied by the actuation element on the diaphragm.

Exemplary embodiments might also relate to a method for assembling a sensing die of a force sensor (e.g. similar to those described above, which may be considered optionally incorporated herein with respect to the discussion of the system). Such method embodiments, for example, might include, but are not limited to, the following:

In a twenty-third embodiment, a method for assembling a sensing die of a force sensor, wherein assembling comprises: creating a plurality of recesses in a first surface of a support wafer; creating a plurality of channels in a first surface of a support wafer, wherein the plurality of channels intersect one or more of the plurality of recesses; bonding a cap wafer to the first surface of the support wafer; applying sense elements to a first surface of the cap wafer; and dicing/sawing/cutting/segmenting the bonded cap wafer and support wafer to form a plurality of sensing die. A twenty-fourth embodiment can include the method of the twenty-third embodiment, wherein each sensing die of the plurality of sensing die comprises a portion of the support wafer, a portion of the cap wafer, a recess, and one or more channels of the plurality of channels. A twenty-fifth embodiment can include the method of the twenty-third to twenty-fourth embodiments, wherein prior to sawing the bonded cap wafer and support wafer to form a plurality of sensing die, the plurality of recesses are vacuum sealed between the cap wafer and the support wafer. A twenty-sixth embodiment can include the method of the twenty-third to twenty-fifth embodiments, wherein dicing the bonded cap wafer and support wafer opens up the channels at the edges of the sensing die and vents the recess of the sensing die. A twenty-seventh embodiment can include the method of the twenty-third to twenty-sixth embodiments, wherein the recess is located at the center of the sensing die between the portion of the support wafer and the portion of the cap wafer, and wherein the one or more channels extend from the recess to the edges of the sensing die. A twenty-eighth embodiment can include the method of the twenty-third to twenty-seventh embodiments, wherein the one or more channels extend symmetrically from the recess to the corners of the sensing die. A twenty-ninth embodiment can include the method of the twenty-third to twenty-eighth embodiments, wherein the sense elements are supported by a first side of a portion of the cap wafer, wherein the sense elements are located symmetrically around the center of the portion of the cap wafer. A thirtieth embodiment can include the method of the twenty-third to twenty-ninth embodiments, wherein the sense elements lay approximately above the intersection between the one or more channels and the recess. A thirty-first embodiment can include the method of the twenty-third to thirtieth embodiments, wherein the sense elements lay approximately above the edges of the recess.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification, and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure. Specifically and by way of example, although the headings might refer to a "Field," the claims should not be limited by the language chosen under this heading to describe the so-called field. Further, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should not be constrained by the headings set forth herein.

Use of broader terms such as "comprises," "includes," and "having" should be understood to provide support for narrower terms such as "consisting of," "consisting essentially of," and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system, or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A force sensor comprising:
   a sensing die comprising a cap and a support, wherein the cap is coupled to a first surface of the support and comprises a sensing diaphragm, wherein the support comprises a buried cavity in the first surface, and wherein the sensing diaphragm is located adjacent to the buried cavity;
   one or more channels located between the first surface of the support and the cap, wherein the one or more channels extend from the buried cavity to the outer edges of the support;
   an actuation element configured to transmit a force to the sensing diaphragm of the sensing die; and
   one or more sense elements supported by the sensing diaphragm of the cap.

2. The force sensor of claim 1, wherein the actuation element is a spherical ball bearing comprising stainless steel, a polymer, a ceramic, or combinations thereof.

3. The force sensor of claim 1, further comprising one or more electrical contacts supported by the cap, wherein each of the one or more electrical contacts are positioned adjacent to the sensing diaphragm and are electrically connected to the one or more sense elements, and wherein the one or more sense elements comprise one or more piezoresistive elements.

4. The force sensor of claim 3, further comprising a substrate located adjacent to the sensing die, wherein the substrate comprises electrical traces, and wherein the one or more electrical contacts are configured to be electrically coupled to the electrical traces of the substrate.

5. The force sensor of claim 4, wherein the substrate is bonded to a second surface of the support, and wherein the bond comprises at least one of: direct bonding, adhesive, solder, or any combinations thereof.

6. The force sensor of claim 3, further comprising one or more bond pads, wherein the one or more electrical contacts is electrically coupled to the one or more bond pads.

7. The force sensor of claim 1, wherein the buried cavity is defined by a void between a second surface of the cap and the first surface of the support.

8. The force sensor of claim 1, wherein the one or more channels and the cavity are formed by etching, and wherein etching comprises at least one of: KOH wet etching, deep reactive ion etching (DRIP), plasma etching, or any combinations thereof.

9. The force sensor of claim 1, wherein the one or more channels vent the buried cavity to the edges of the sensing die, wherein the one or more channels ensure the output signal from the force sensor is related to the force applied by the actuation element on the sensing diaphragm, and wherein venting the cavity to the edges of the sensing die removes ambient pressure variation and atmospheric pressure variation and equalizes the pressure above and below the sensing diaphragm.

10. The force sensor of claim 1, wherein a surface of the cavity comprises a planar, uniform surface, wherein the sensing diaphragm is configured to contact the surface of the cavity.

11. The force sensor of claim 1, wherein the second surface of the cap is bonded to the first surface of the support by silicon fusion bonding.

12. The force sensor of claim 1, wherein the depth of the cavity is greater than the depth of the one or more channels.

13. A method for detecting three using a force sensor, the method comprising:
   applying a force to the force sensor, the force sensor comprising a sensing die, wherein the sensing die comprises a cap and a support, wherein a buried cavity and one or more channels are located between the cap and the support, wherein the one or more channels extend from the buried cavity to the outer edges of the support, wherein a portion of the cap defines a sensing diaphragm, and wherein the force sensor comprises one or more sense elements supported by the sensing diaphragm and an actuation element configured to transmit a force to the sensing diaphragm;
   detecting a force increase at a first rate while the sensing diaphragm moves freely within the cavity;
   at least partially contacting the sensing diaphragm to a surface of the cavity;
   detecting the force increase at a second rate while the sensing diaphragm at least partially contacts the surface of the cavity; and
   venting the buried cavity by the one or more channels.

14. The method of claim 13, wherein the one or more channels vent the buried cavity to the edges of the sensing die, wherein venting the cavity to the edges of the sensing die removes ambient pressure variation and atmospheric pressure variation and equalizes the pressure above and below the diaphragm, and wherein the output signal from the force sensor indicates the force applied by the actuation element on the diaphragm.

15. A method for assembling a force sensor, wherein assembling comprises:
   creating a plurality of recesses in a first surface of a support wafer;
   creating a plurality of channels in a first surface of a support wafer, wherein the plurality of channels intersect one or more of the plurality of recesses;
   bonding a cap wafer to the first surface of the support wafer, wherein the cap wafer comprises a sensing diaphragm;
   applying sense elements to a first surface of the cap wafer;
   dicing the bonded cap wafer and support wafer to form a plurality of sensing dies; and
   positioning an actuation element above one of the sensing dies to form a force sensor, wherein the actuation element is configured to transmit a force to the sensing diaphragm of the sensing die.

16. The method of claim 15, wherein each sensing die of the plurality of sensing die comprises a portion of the support wafer, a portion of the cap wafer, a recess, and one or more channels of the plurality of channels.

17. The method of claim 15, wherein prior to dicing the bonded cap wafer and support wafer to form a plurality of sensing die, the plurality of recesses are vacuum sealed between the cap wafer and the support wafer.

18. The method of claim 16, wherein dicing the bonded cap wafer and support wafer opens up the channels at the edges of the sensing die and vents the recess of the sensing die.

19. The method of claim 16, wherein the recess is located at the center of the sensing die between the portion of the support wafer and the portion of the cap wafer, and wherein the one or more channels extend from the recess to the edges of the sensing die.

20. The method of claim 15, wherein the sense elements lay approximately above the intersection between the one or more channels and the corresponding recess.

* * * * *